United States Patent
Wu

(10) Patent No.: US 9,019,713 B2
(45) Date of Patent: Apr. 28, 2015

(54) PORTABLE ELECTRONIC APPARATUS

(71) Applicant: Wistron Corporation, New Taipei (TW)

(72) Inventor: Jing-Tang Wu, New Taipei (TW)

(73) Assignee: Wistron Corporation, New Taipei (TW)

( * ) Notice: Subject to any disclaimer, the term of this patent is extended or adjusted under 35 U.S.C. 154(b) by 250 days.

(21) Appl. No.: 13/852,864

(22) Filed: Mar. 28, 2013

(65) Prior Publication Data

US 2014/0078707 A1 Mar. 20, 2014

(30) Foreign Application Priority Data

Sep. 14, 2012 (TW) .............................. 101217866 U

(51) Int. Cl.
- *H05K 5/00* (2006.01)
- *H05K 7/14* (2006.01)
- *G06F 1/16* (2006.01)

(52) U.S. Cl.
CPC *H05K 7/14* (2013.01); *G06F 1/162* (2013.01); *G06F 1/1681* (2013.01); *G06F 1/1683* (2013.01)

(58) Field of Classification Search
USPC .................. 361/807, 809, 810, 679, 755; 455/575.1–575.4
See application file for complete search history.

(56) References Cited

U.S. PATENT DOCUMENTS

| | | | | |
|---|---|---|---|---|
| 6,006,243 A * | 12/1999 | Karidis | ......................... | 708/100 |
| 6,295,038 B1 * | 9/2001 | Rebeske | ......................... | 345/1.1 |
| 8,050,030 B2 * | 11/2011 | Wu et al. | .................. | 361/679.58 |
| 8,228,678 B2 * | 7/2012 | Hasegawa et al. | ............ | 361/755 |
| 8,848,354 B2 * | 9/2014 | Sung et al. | ................ | 361/679.27 |
| 8,917,501 B2 * | 12/2014 | Hokugou et al. | ......... | 361/679.27 |
| 2013/0305489 A1 * | 11/2013 | Liang | .............................. | 16/277 |

* cited by examiner

*Primary Examiner* — Hung S Bui

(74) *Attorney, Agent, or Firm* — Muncy, Geissler, Olds & Lowe, P.C.

(57) ABSTRACT

A portable electronic apparatus includes a first body, a rotating structure, a supporting element, and a second body. The first body includes an upper surface. The rotating structure combines with the first body and rotates relative to the first body around a first axis which is substantially perpendicular to the upper surface. The supporting element combines with the rotating structure and rotates relative to the rotating structure around a second axis which is substantially parallel to the upper surface. The supporting element includes a main structure and at least one sliding portion disposed at the main structure. The second body includes at least one corresponding sliding portion disposed corresponding to the at least one sliding portion. The second body movably combines with each sliding portion of the supporting element through each of the corresponding sliding portions, such that the second body slides relative to the supporting element.

12 Claims, 8 Drawing Sheets

PORTABLE ELECTRONIC APPARATUS

BACKGROUND OF THE DISCLOSURE

1. Field of the Disclosure

The disclosure relates to a portable electronic apparatus, and more particularly, to a portable electronic apparatus which provides different operating patterns by changing the relative position of main components.

2. Description of the Related Art

Compared to desktop computers, laptop computers are portable, easy to carry and use anywhere, anytime, and thus they are widely loved by consumers. Conventional laptop computers employ the clamshell design and can only allow the display screen on the upper lid to flip and open relative to the main body. In recent years, tablet PCs launched by Apple Inc. have led another trend such that many companies compete to develop similar products. The tablet PC leaves out a keyboard and an input device generally used in laptop computers, which not only makes the tablet PC light and easy to carry, and the design of touch input gives consumers different operating experiences.

However, for users who get used to laptop computers, if they needs to performs some word processing by tablet PCs, such touch input method may cause inconvenience. Accordingly, manufacturers have designed additional input devices that can combine with tablet PCs and the combination has been used similar to laptop computers. Nevertheless, when the user wants to perform touch operations, the tablet PC needs to be separated from the additional input device. Repeatedly assembling/disassembling the tablet PC and the additional input device may cause troubles for users. If the advantages of both tablet PCs and laptop computers can be combined, the effect of one machine for two usages can be achieved by changing between a tablet mode and a laptop mode with the position change of the display screen using the specific design for laptop computers.

SUMMARY OF THE DISCLOSURE

It is a major objective of the present disclosure to provide a portable electronic apparatus to present different operating patterns by changing the relative position of main components.

To achieve the above-mentioned objective, the portable electronic apparatus of the present disclosure includes a first body, a rotating structure, a supporting element, and a second body. The first body includes an upper surface. The rotating structure combines with the first body and rotates relative to the first body around a first axis. The first axis is substantially perpendicular to the upper surface. The supporting element combines with the rotating structure and rotates relative to the rotating structure around a second axis. The second axis is substantially parallel to the upper surface. The supporting element includes a main structure and at least one sliding portion disposed at the main structure. The second body includes at least one corresponding sliding portion disposed corresponding to the at least one sliding portion. The second body movably combines with each sliding portion of the supporting element through each of the corresponding sliding portions, such that the second body slides relative to the supporting element.

In an embodiment of the disclosure, the rotating structure includes a mount and a rotating element. The mount is fixed at the first body, and the rotating element rotatably combines with the mount around the first axis. The rotating element includes a pivoting portion, and the supporting element further includes a corresponding pivoting portion. The supporting element rotatably combines with the pivoting portion of the rotating element through the corresponding pivoting portion, such that the supporting element is able to rotate relative to the rotating element around the second axis.

In an embodiment of the disclosure, the corresponding pivoting portion is protrudingly disposed at the main structure, such that the second axis and the main structure are not positioned on a same plane. Specifically, the first axis and the second axis are not intersecting each other.

In an embodiment of the disclosure, the portable electronic apparatus further includes a transmission line which is connected from the first body, through the rotating structure and the supporting element, and finally to the second body. The at least one sliding portion of the supporting element further includes a first hole and a second hole, and the transmission line passes through the first hole and the second hole to provide wire positioning function by means of the at least one sliding portion.

Accordingly, the user only needs to slide the second body relative to the first body and rotate the second body around the first axis and second axis, and the position of the second body can be changed relative to the first body to present different operating patterns. Therefore, the user can use the portable electronic apparatus based on their needs.

DETAILED DESCRIPTION OF THE PREFERRED EMBODIMENT

To better explain the aforementioned and other objectives, advantages and features of the disclosure, following embodiments are provided accompanied with drawings for detailed disclosure.

Figure 1:
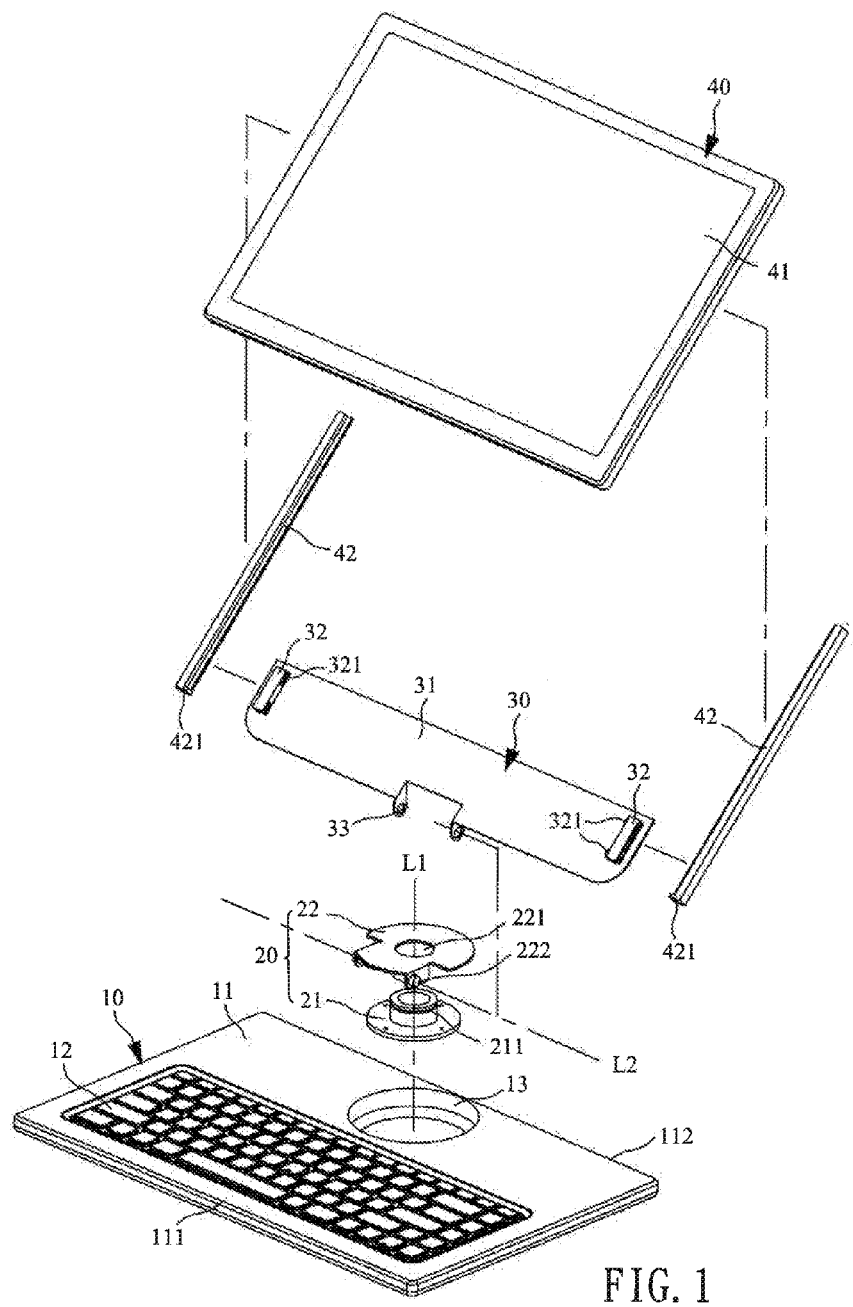
FIG. 1 is an exploded view of a portable electronic apparatus in the present disclosure.

Please refer to FIG. 1. FIG. 1 is an exploded view of a portable electronic apparatus 1 in the present disclosure. In an embodiment of the disclosure, the portable electronic apparatus 1 can be a laptop, a minicomputer or a combination of a tablet PC and an expansion unit including an input module. Depending on different application types, the portable electronic apparatus 1 can also be other electronic device with a clamshell display module, but it is not limited to this.

As shown in FIG. 1, the portable electronic apparatus 1 of the present disclosure includes a first body 10, a rotating structure 20, a supporting element 30, and a second body 40. In an embodiment of the disclosure, the portable electronic apparatus 1 is used as a laptop, for example, the first body 10 is a main base, and the second body 40 is a display device with touch input function. The first body 10 includes an upper surface 11 and an input module 12. The upper surface 11 comprises a front side 111 and a back side 112; the input module 12 is disposed on the upper surface 11 near the front side 111 for inputting operating instructions by an user. The input module 12 includes at least one of a keyboard, touch pad and mouse or a combination of thereof, but the disclosure is not limited to this.

The rotating structure 20 combines with the first body 10 and rotates around a first axis L1 relative to the first body 10. The first axis L1 is substantially perpendicular to the upper surface 11. In an embodiment of the present disclosure, the first body 10 further includes a receiving slot 13 disposed on the upper surface 11 near the back side 112 for receiving the rotating structure 20, such that the rotating structure 20 will not protrude the upper surface 11. In other different designs, the receiving slot 13 can be omitted, and the rotating structure 20 can be protrudingly disposed on the upper surface 11 directly.

In this embodiment, the rotating structure 20 includes a mount 21 and a rotating element 22. The mount 21 is fixed at the first body 10 by locking elements (for example, lugs, screw fasteners, etc.). The mount 21 includes a ring-shaped groove 211. The rotating element 22 includes a shaft hole 221 and a pivoting portion 222. The shaft hole 221 is disposed inside the rotating element 22, and the mount 21 passes through the shaft hole 221 of the rotating element 22, such that the rotating element 22 engages with the ring-shaped groove 211 of the mount 21. A center of the shaft hole 221 corresponds to the first axis L1, such that the rotating element 22 rotatably combines with the mount 21 around the first axis L1. The pivoting portion 222 is disposed at an outer edge of the rotating element 22 corresponding to a second axis L2. The first axis L1 and the second axis L2 are not intersecting each other. The pivoting portion 222 is a pivoting component with rotary positioning function, but the disclosure is not limited to this.

The supporting element 30 further includes a main structure 31, at least one sliding portion 32, and a corresponding pivoting portion 33. Each of the sliding portions 32 and each of the corresponding pivoting portions 33 are protrudingly disposed on the main structure 31. In an embodiment of the present disclosure, the main structure 31 is a plane-like structure. The at least one sliding portion 32 includes two sliding portions 32 respectively disposed on two sides of the main structure 31. The corresponding pivoting portion 33 is disposed between the two sliding portions 32, and the two sliding portions 32 are symmetrically disposed with reference to the corresponding pivoting portion 33.

The supporting element 30 rotatably combines with the pivoting portion 222 of the rotating element 22 by the corresponding pivoting portion 33, such that the supporting element 30 rotates relative to the rotating element 22 around the second axis L2. The second axis L2 is substantially parallel to the upper surface 11 of the first body 10. The corresponding pivoting portion 33 is protrudingly disposed on a surface of the main structure 31 to combine with the pivoting portion 222, such that the second axis L2 by which the supporting element 30 rotates around and the main structure 31 are not positioned on a same plane.

The second body 40 includes a display surface 41 and at least one corresponding sliding portion 42. The display surface 41 shows display signals and provides touch input function. In an embodiment of the present disclosure, wireless transmission is used for signal transmission between the second body 40 and the first body 10, such that the second body 20 receives display signals from the first body 10, or the second body 20 sends touch operation signals to the first body 10, but the disclosure is not limited to this. The number and position of the corresponding sliding portion 42 correspond to the sliding portion 32, such that the second body 40 movably combines with each sliding portion 32 of the supporting element 30 by each corresponding sliding portion 42. Therefore, the second body 40 can slide relative to the supporting element 30.

In an embodiment of the present disclosure, the at least one corresponding sliding portion 42 includes two corresponding sliding portions 42, and the two corresponding sliding portions 42 respectively disposed on two sides of a back surface (i.e. an opposite surface to the display surface 41) of the second body 40 to correspond to the two sliding portions 32 of the supporting element 30. However, with different designs of structures and sizes, the two corresponding sliding portions 42 are also disposed on two side surfaces of the second body 40. Each sliding portion 32 is a slide block, and each corresponding sliding portion 42 is a slide rail. Further, wheel elements 321 are disposed on each sliding portion 32 to assist the sliding portion 32 to slide along the corresponding sliding portion 42, but the disclosure is not limited to this.

In addition, to prevent the sliding portion 32 from departing from the corresponding sliding portion 42 when the sliding portion 32 slides along the corresponding sliding portion 40, each corresponding sliding portion 42 includes a limit structure 421 for limiting a sliding position of each sliding portion 32 relative to the corresponding sliding portion 42. The limit structure 421 can be a structure integrated with the corresponding sliding portion 42, or an independent component additionally disposed in the corresponding sliding portion 42. The limit structure 421 is disposed at an end or any other location of the corresponding sliding portion 42.

Figure 2:
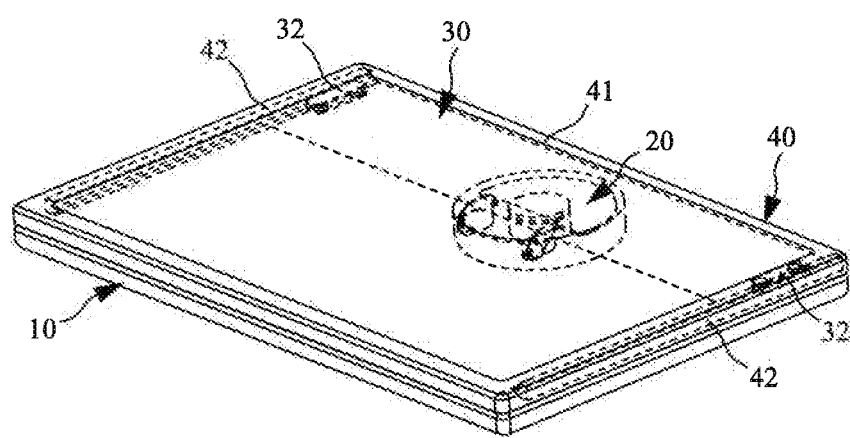
FIG. 2 is a view showing the portable electronic apparatus of the present disclosure in a tablet mode.
Figure 3:
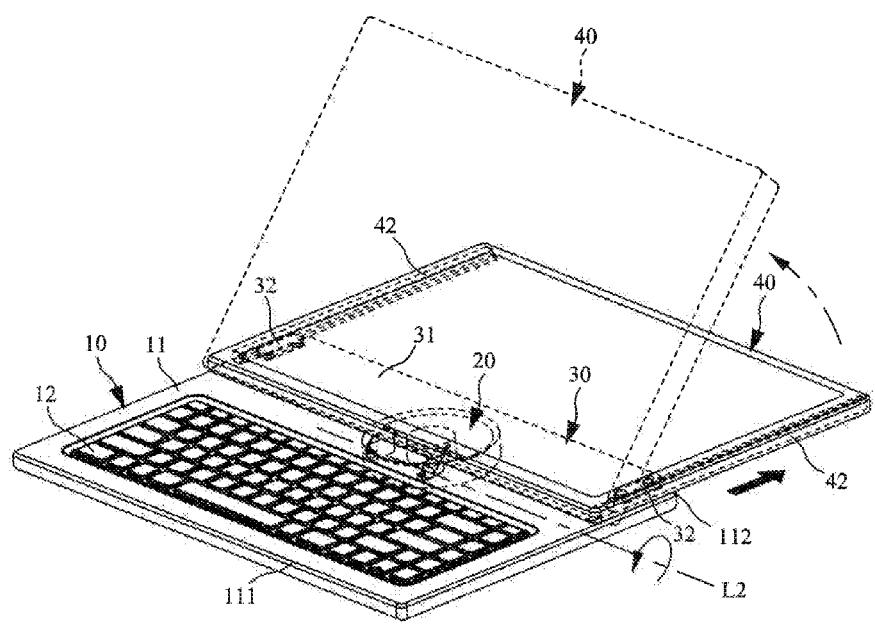
FIG. 3 is a view showing the portable electronic apparatus of the present disclosure changed from the tablet mode to a laptop mode.

Please refer to both FIG. 2 and FIG. 3. FIG. 2 is a view showing the portable electronic apparatus of the present disclosure in a tablet mode; FIG. 3 is a view showing the portable electronic apparatus of the present disclosure changed from the tablet mode to a laptop mode.

As shown in FIG. 2, when the portable electronic apparatus 1 of the present disclosure is used in a tablet mode, the second body 40 is folded onto the first body 10. At this time, the exposed display surface 41 of the second body 40 is allowed for touch operations or provides screen display as a tablet PC.

To change the portable electronic apparatus 1 of the present disclosure to the laptop mode, as shown in FIG. 3, the user forces the second body 40 toward the back side 112 of the upper surface 11 of the first body 10. At this time, by the interactions between the corresponding sliding portion 42 of the second body 40 and the sliding portion 32 of the supporting element 30, the second body 40 slides substantially horizontally relative to the supporting element 30 and the first body 10, and the whole of the second body 40 slides to across the second axis L2 (e.g. the position of the second body 40 is indicated by solid lines in FIG. 3).

Then, the second body 40 is forced to rotate around the second axis L2 to a specific position, such that the second body 40 drives the supporting element 30 to move relative to the first body 10 to present an included angle (e.g. the position of the second body 40 indicated by dotted lines in FIG. 3). The portable electronic apparatus is changed to the laptop mode, and the user performs the corresponding input operation by the input module 12. Because the whole of the second body 40 is across the second axis L2, and the main structure 31 of the supporting element 30 is not on the same plane with the second axis L2, the supporting element 30 and the second body 40 will not be interfered by the rotating structure 20 and the first body 10 during rotating around the second axis L2, and the rotation of the supporting element 30 and the second body 40 is more smooth.

In contrary, when the user wants to change the portable electronic apparatus from the laptop mode to the tablet mode as shown in FIG. 2, he or she only needs to perform the operations reversely. First, the second body 40 rotates reversely relative to the first body 10 around the second axis L2, such that the second body 40 is substantially horizontal with the first body 10; and then the second body 40 is forced toward the front side 111 of the upper surface 11 of the first body 10 to move back to the position where the second body 40 is folded onto the first body 10.

Figure 4:
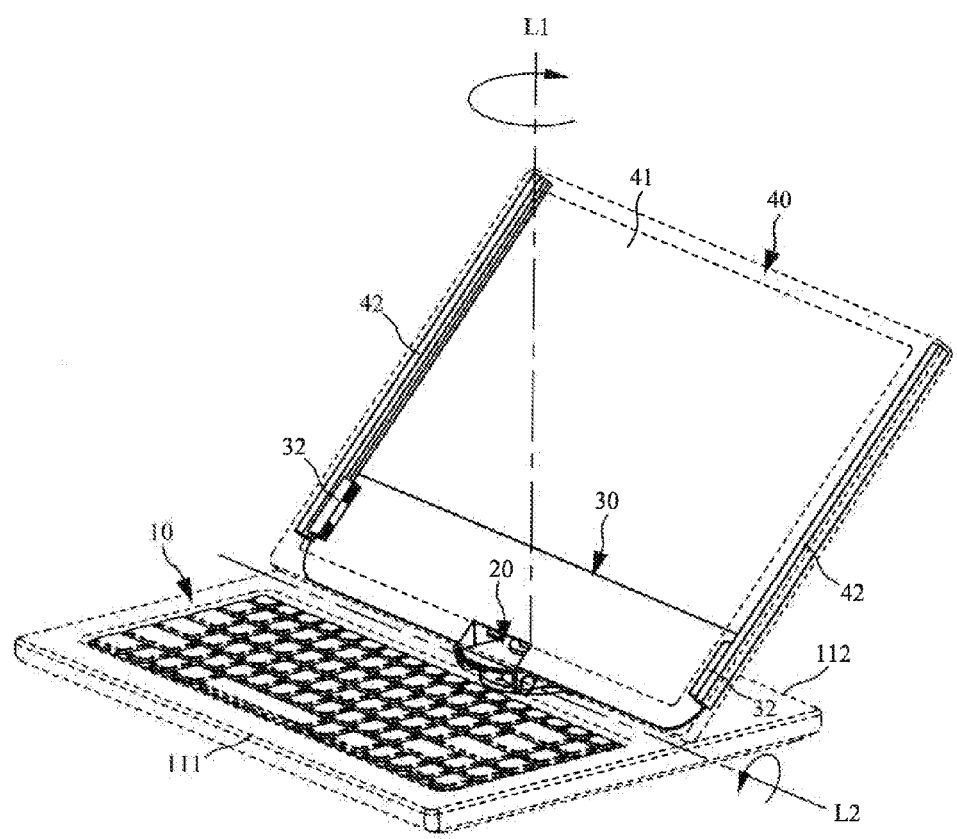
FIG. 4 is a view showing a second body of the portable electronic apparatus in the present disclosure being rotated around a first axis in the laptop mode.
Figure 5:
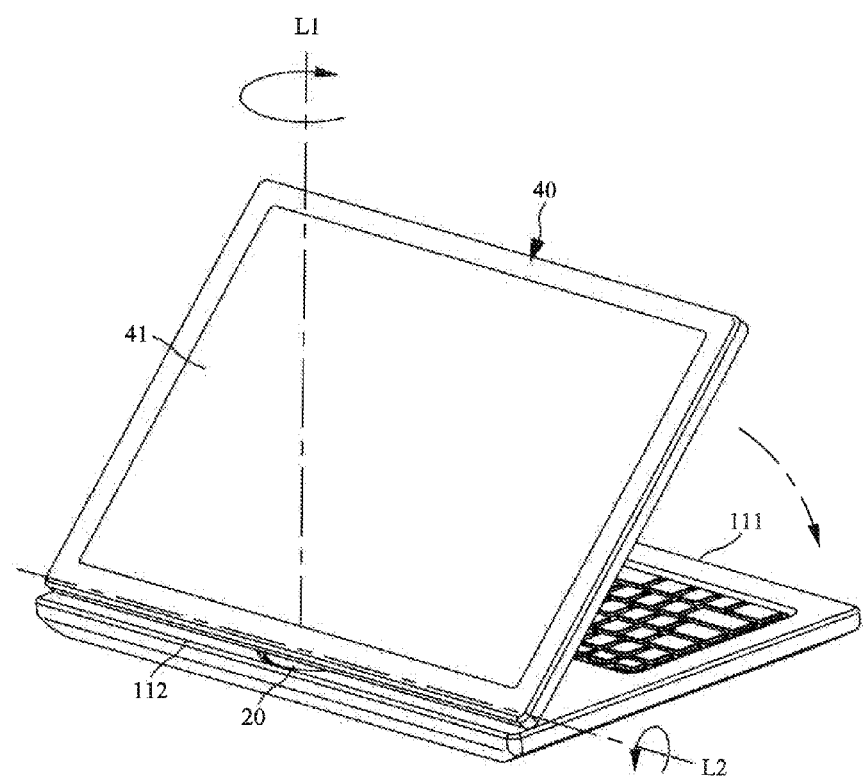
FIG. 5 is a view showing the second body in FIG. 4 after rotating 180 degrees around the first axis from another viewing angle.
Figure 6:
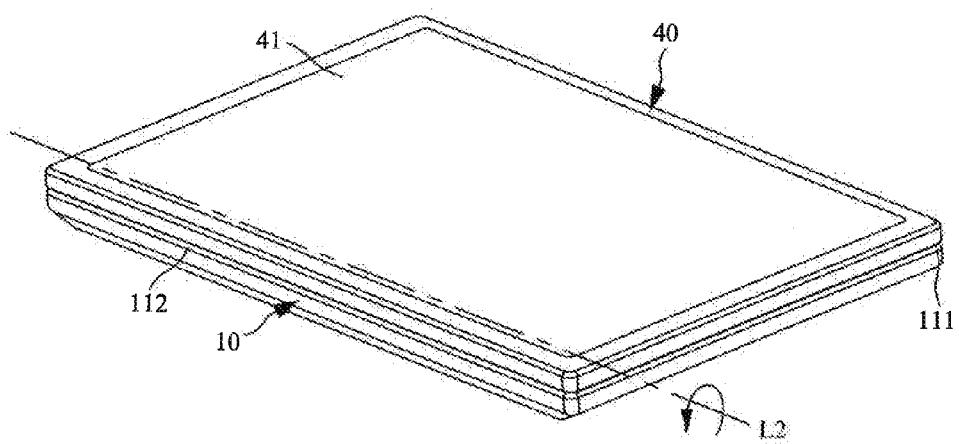
FIG. 6 is a view showing the second body in FIG. 5 rotating around the second axis and then being folded onto the first body.

Please refer to FIG. 4 to FIG. 6. FIG. 4 is a view showing a second body 40 of the portable electronic apparatus 1 in the present disclosure rotating around a first axis L1 in the laptop mode; FIG. 5 is a view showing the second body 40 in FIG. 4 after rotating 180 degrees around the first axis L1 from another viewing angle; FIG. 6 is a view showing the second body 40 in FIG. 5 rotating around the second axis L2 and then being folded onto the first body 10.

The user may have different needs. For example, if the user wants to watch video by the portable electronic apparatus 1 of the present disclosure, he or she hopes that the display surface 41 is closer to him or her and keeps a proper angle, and the display surface 41 is not need to be manually support. As shown in FIG. 4, the user can force the second body 40 and the supporting element 30 to rotate relative to the first body 10 around the first axis L1, then the portable electronic apparatus 1 is shown as FIG. 5 after the second body 40 and the supporting element 30 rotate 180 degrees. At this time, an included angle is presented between the back end 112 of the second body 40 and the first body 10. The user who is close to the front end 111 of the first body 10 only needs to turn the whole of the portable electronic apparatus 1 in the present disclosure 180 degrees, and the display surface 41 will be closer to him or her. Besides, the second body 40 is able to be supported.

When the portable electronic apparatus 1 of the present disclosure is under the type as shown in FIG. 5, the user only needs to rotate the second body 40 and the supporting element 30 towards the first body 10 around the second axis L2, and then the second body 40 is directly folded onto the first body 10 similar to the tablet mode, as shown in FIG. 6. The user does not need to perform several reversal operations as described above to go back to the tablet mode as shown in FIG. 1. Comparing the tablet mode in FIG. 6 with FIG. 1, the second body 40 shows an angle difference of 180 degrees after rotating around the first axis L1 compared with FIG. 1. Accordingly, the user can change the type of the portable electronic apparatus 1 as shown in FIG. 5 to the type as shown in FIG. 6 by the rotation operation of the second body 40, such that the portable electronic apparatus 1 is carried or stored easy.

Figure 7:
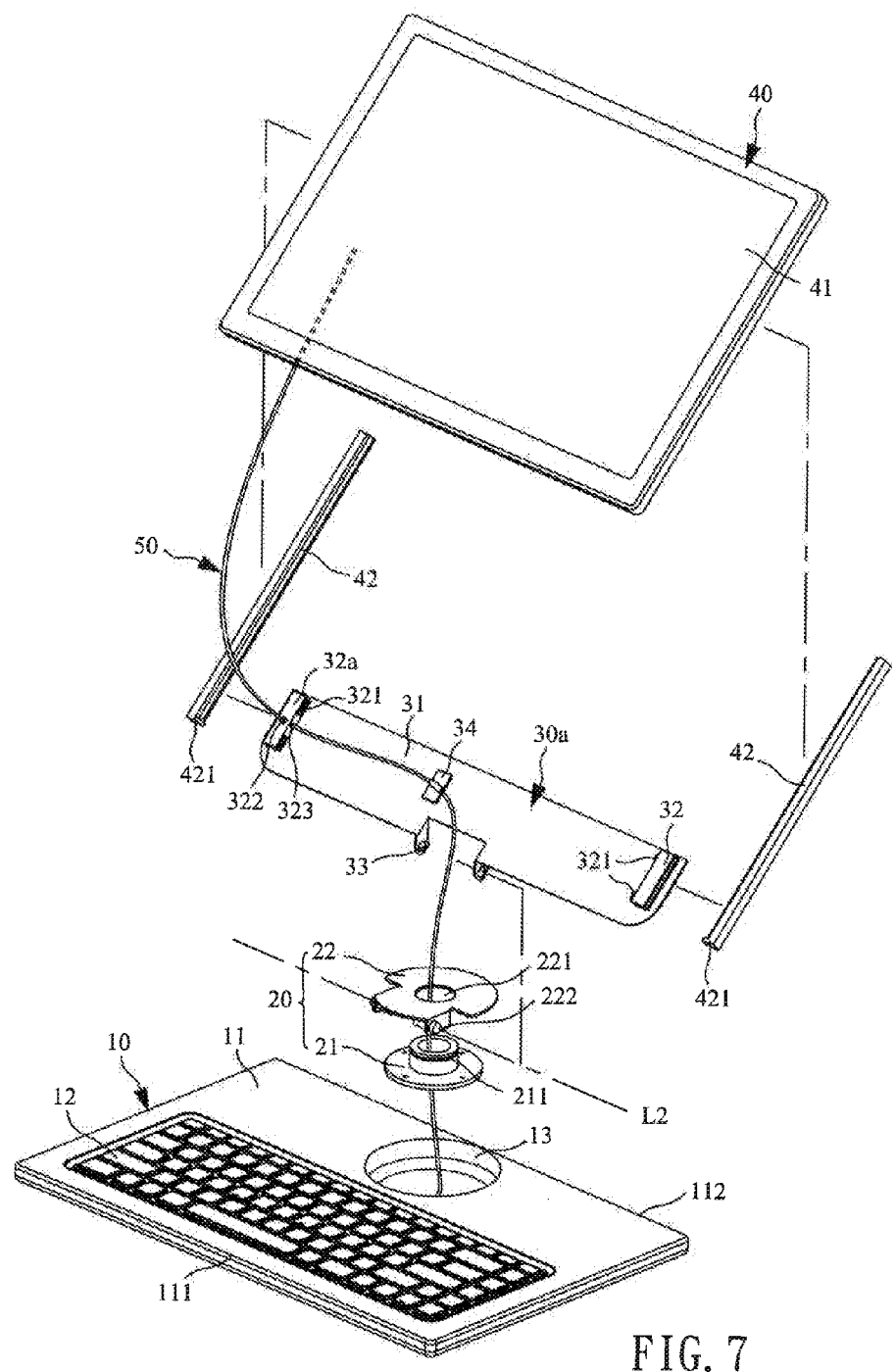
FIG. 7 is an exploded view of the portable electronic apparatus in another embodiment of the present disclosure.
Figure 8:
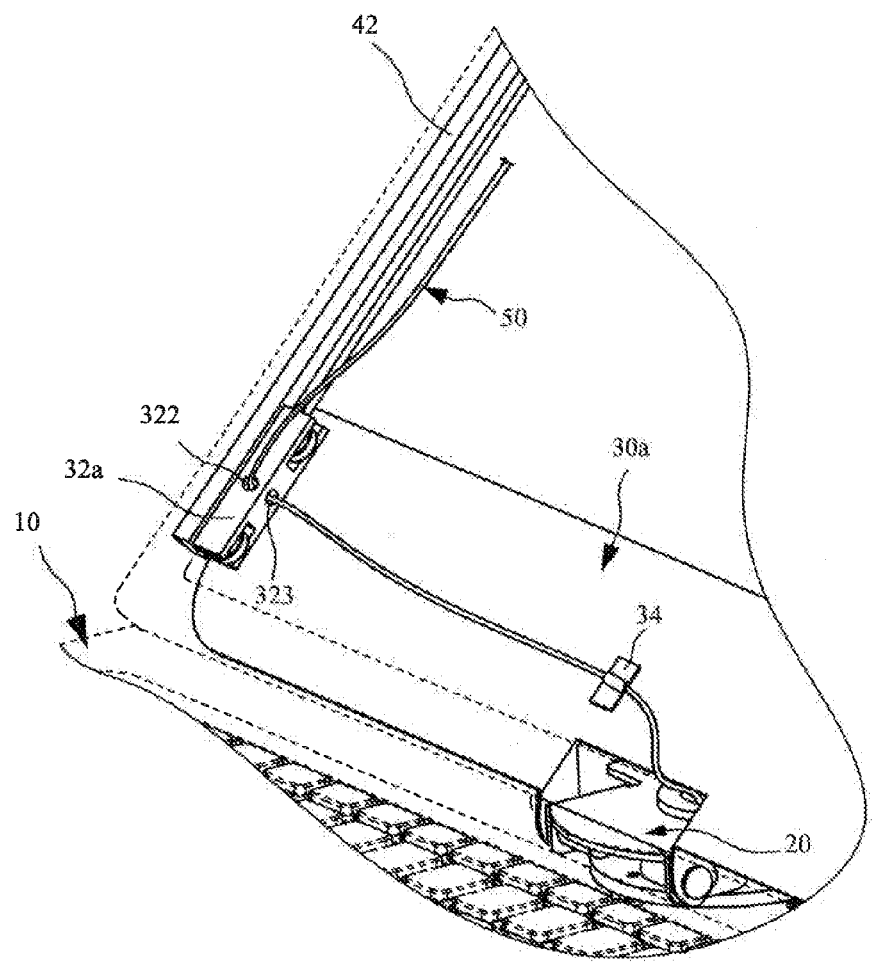
FIG. 8 shows a configuration of a transmission line after the portable electronic apparatus in another embodiment of the present disclosure is assembled.

Please refer to both FIG. 7 and FIG. 8. FIG. 7 is an exploded view of the portable electronic apparatus 1a in another embodiment of the present disclosure; FIG. 8 is a view showing a configuration of a transmission line 50 after the portable electronic apparatus 1a in another embodiment of the disclosure is assembled.

This embodiment is a variation of the aforementioned embodiment, wherein a signal transmission between the first body 10 and the second body 40 is changed from wireless transmission to wire transmission. As shown in FIG. 7 and FIG. 8, in this embodiment, the portable electronic apparatus 1a further comprises a transmission line 50. The transmission line 50 is connected from the first body 10, through the rotating structure 20 and the supporting element 30a, and finally to the second body 40. The signal transmission between the first body 10 and the second body 40 is performed by the transmission line 50.

One of the at least one sliding portion 32a of the supporting element 30a further comprises a first hole 322 and a second hole 323. The first hole 322 is disposed on a surface of the sliding portion 32a facing the second body 40, and a gap is formed between the sliding portion 32a and the second body 40. The second hole 323 is disposed on an opposite side of the sliding portion 32a combines with the corresponding sliding portion 42. Accordingly, the transmission line 50 connected to the second body 40 passes through the gap between the sliding portion 32a and the second body 40 to penetrate into the first hole 322, and then passes through the second hole 323 to provide wire positioning by the sliding portion 32a. In addition, the supporting element 30a further includes at least one wire fixing portion 34 disposed on the main structure 31. The transmission line 50 passed through the second hole 323 is positioned by each wire fixing portion 34 to provide additional wire positioning function, such that the transmission line 50 is extended and fixed along the supporting element 30a, and passes through the mount 21 of the rotating structure 20 and the rotating element 22 to connect to the first body 10.

Therefore, when the second body 40 slides or rotates relative to the first body 10, the transmission line 50 is always limited by the sliding portion 32a and the wire fixing portion 34, such that the transmission line 50 will not be arbitrarily swung to interfere the second body 40. It can ensure the second body 40 to move relative to the first body 10 more smoothly. Also, the transmission line 50 is covered by each components and substantially less likely exposed, by which the whole appearance of the device is improved.

Accordingly, the portable electronic apparatus 1 or 1a in the present disclosure allows the user to rotate the second body 40 relative to the first body 110 around different axes and change different modes such as the tablet mode or the laptop mode to provide flexible applications. It should be noted that the portable electronic apparatus 1 or 1a is used as a laptop in the foregoing embodiment of the disclosure for example, but the present disclosure is not limited to this. For example, it can also be applied when the first body 10 is taken as an expansion unit with an input module and the second body 40 is taken as a tablet PC.

The foregoing descriptions of embodiments of the present disclosure have been presented only for purposes of illustration and description. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:

1. A portable electronic apparatus, comprising:
a first body comprising an upper surface;
a rotating structure combining with the first body and rotating relative to the first body around a first axis which is substantially perpendicular to the surface;
a supporting element combining with the rotating structure and rotating relative to the rotating structure around a second axis which is parallel to the surface; the supporting element comprising a main structure and at least one sliding portion disposed at the main structure; and a second body comprising at least one corresponding sliding portion disposed corresponding to the at least one sliding portion; through each of the corresponding sliding portions, the second body movably combines with each sliding portion of the supporting element, such that the second body sliding relative to the supporting element.

2. The portable electronic apparatus as claimed in claim 1, wherein the rotating structure comprises a mount fixed at the first body and a rotating element rotatably combined with the mount around the first axis.

3. The portable electronic apparatus as claimed in claim 2, wherein the rotating element comprises a pivoting portion, and the supporting element further comprises a corresponding pivoting portion; the supporting element rotatably combining with the pivoting portion of the rotating element through the corresponding pivoting portion, such that the supporting element is able to rotate relative to the rotating element around the second axis.

4. The portable electronic apparatus as claimed in claim 3, wherein the corresponding pivoting portion is protrudingly disposed at the main structure, such that the second axis and the main structure are not positioned on a same plane.

5. The portable electronic apparatus as claimed in claim 4, wherein the at least one sliding portion comprises two sliding portions; the corresponding pivoting portion are disposed between the two sliding portions, and the two sliding portions are symmetrically disposed with reference to the corresponding pivoting portion.

6. The portable electronic apparatus as claimed in claim 1, wherein the first body comprises a receiving slot disposed on the upper surface for receiving the rotating structure.

7. The portable electronic apparatus as claimed in claim 1, wherein each of the corresponding sliding portions comprises a limit structure for limiting the slide position of each sliding portion.

8. The portable electronic apparatus as claimed in claim 1, wherein each sliding portion is a slide block, and each corresponding sliding portion is a slide rail.

9. The portable electronic apparatus as claimed in claim 1, wherein the first axis and the second axis are not intersecting each other.

10. The portable electronic apparatus as claimed in claim 1, wherein the first body further comprises an input module disposed on the upper surface.

11. The portable electronic apparatus as claimed in claim 1, further comprises a transmission line connected from the first body, through the rotating structure and the supporting element, and to the second body; wherein one of the at least one sliding portion of the supporting element further includes a first hole and a second hole, and the transmission line passes through the first hole and the second hole to provide wire positioning function by the sliding portion.

12. The portable electronic apparatus as claimed in claim 11, wherein the supporting element further comprises at least one wire fixing portion disposed on the main structure to provide additional wire positioning for the transmission line.

* * * * *